(12) United States Patent
Ahn et al.

(10) Patent No.: US 11,037,894 B2
(45) Date of Patent: Jun. 15, 2021

(54) SEMICONDUCTOR DEVICE HAVING METAL BUMP AND METHOD OF MANUFACTURING THE SAME

(71) Applicant: SAMSUNG ELECTRONICS CO., LTD., Suwon-si (KR)

(72) Inventors: Jinchan Ahn, Hwaseong-si (KR); Won-young Kim, Seoul (KR); Chanho Lee, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/923,406

(22) Filed: Jul. 8, 2020

(65) Prior Publication Data
US 2020/0343204 A1    Oct. 29, 2020

Related U.S. Application Data

(63) Continuation of application No. 16/151,724, filed on Oct. 4, 2018, now Pat. No. 10,714,438.

(30) Foreign Application Priority Data

Jan. 3, 2018  (KR) .......................... 10-2018-0000774

(51) Int. Cl.
*H01L 23/00*  (2006.01)
*H01L 23/522*  (2006.01)

(52) U.S. Cl.
CPC ............ *H01L 24/02* (2013.01); *H01L 23/522* (2013.01); *H01L 24/11* (2013.01); *H01L 24/13* (2013.01);

(Continued)

(58) Field of Classification Search
CPC . H01L 2224/13013; H01L 2924/37001; H01L 24/11; H01L 24/13; H01L 2924/10271; H01L 24/14; H01L 23/522; H01L 2924/15311; H01L 2224/13024; H01L 2224/1146; H01L 2224/11849; H01L 2224/14517; H01L 2924/1304;
(Continued)

(56) References Cited

U.S. PATENT DOCUMENTS 5,365,095 A    11/1994  Shono et al.
6,940,166 B2    9/2005  Iseda et al.
(Continued)

FOREIGN PATENT DOCUMENTS

JP    2006066505    3/2006
JP    4663510    1/2011
(Continued)

*Primary Examiner* — Jasmine J Clark
(74) *Attorney, Agent, or Firm* — F. Chau & Associates, LLC

(57) ABSTRACT

Provided are a semiconductor device and a method of manufacturing the same. The semiconductor device includes a metal line layer on a semiconductor substrate, and a metal terminal on the metal line layer. The metal line layer includes metal lines, and a passivation layer having a non-planarized top surface including flat surfaces on the metal lines and a concave surface between the metal lines. The metal terminal is provided on the passivation layer. Opposite lateral surfaces of the metal terminal facing each other are provided on the flat surfaces of the passivation layer.

20 Claims, 20 Drawing Sheets

(52) U.S. Cl.
CPC ...... *H01L 24/14* (2013.01); *H01L 2224/0236* (2013.01); *H01L 2224/02311* (2013.01); *H01L 2224/02331* (2013.01); *H01L 2224/02373* (2013.01); *H01L 2224/1146* (2013.01); *H01L 2224/11849* (2013.01); *H01L 2224/13013* (2013.01); *H01L 2224/13024* (2013.01); *H01L 2224/13082* (2013.01); *H01L 2224/13101* (2013.01); *H01L 2224/13147* (2013.01); *H01L 2224/14517* (2013.01); *H01L 2224/16225* (2013.01); *H01L 2924/10252* (2013.01); *H01L 2924/10253* (2013.01); *H01L 2924/10271* (2013.01); *H01L 2924/1304* (2013.01); *H01L 2924/1431* (2013.01); *H01L 2924/15311* (2013.01); *H01L 2924/37001* (2013.01)

(58) Field of Classification Search
CPC . H01L 2924/10253; H01L 2224/02311; H01L 24/02; H01L 2224/13082; H01L 2924/10252; H01L 2224/0236; H01L 2224/02331; H01L 24/81; H01L 2224/16227; H01L 2924/1434; H01L 2224/02373; H01L 2224/13147
See application file for complete search history.

(56) References Cited

U.S. PATENT DOCUMENTS

| | | | |
|---|---|---|---|
| 7,985,671 | B2 | 7/2011 | Daubenspeck et al. |
| 9,666,551 | B1 | 5/2017 | Seo et al. |
| 9,859,242 | B2 | 1/2018 | Chen et al. |
| 2007/0138638 | A1 | 6/2007 | Ota et al. |
| 2009/0032942 | A1 | 2/2009 | Choi |
| 2010/0221889 | A1 | 9/2010 | Youn |
| 2013/0221519 | A1* | 8/2013 | Hwang ............ H01L 23/49811 257/737 |
| 2014/0329382 | A1 | 11/2014 | Hwang et al. |
| 2019/0206816 | A1 | 7/2019 | Ahn et al. |
| 2019/0244878 | A1 | 8/2019 | Kim et al. |

FOREIGN PATENT DOCUMENTS

| | | |
|---|---|---|
| JP | 5759029 | 6/2015 |
| KR | 1020040023311 | 3/2004 |
| KR | 1020170068308 | 6/2017 |

* cited by examiner (COMPARATIVE EXAMPLE)

(COMPARATIVE EXAMPLE)

(COMPARATIVE EXAMPLE)

(COMPARATIVE EXAMPLE)

SEMICONDUCTOR DEVICE HAVING METAL BUMP AND METHOD OF MANUFACTURING THE SAME

CROSS-REFERENCE TO RELATED APPLICATIONS

This application is a continuation of U.S. application Ser. No. 16/151,724, filed on Oct. 4, 2018, now U.S. Pat. No. 10,714,438, issued Jul. 14, 2020, which claims priority under 35 U.S.C. § 119 to Korean Patent Application No. 10-2018-0000774, filed on Jan. 3, 2018, in the Korean Intellectual Property Office, the entire contents of which are herein incorporated by reference.

TECHNICAL FIELD

The present inventive concept relates to a semiconductor device and a method of manufacturing the same, and more particularly, to a semiconductor device having a metal bump and a method of manufacturing the same.

DISCUSSION OF RELATED ART

A semiconductor device generally uses a metal bump as an electrical connection terminal or a dummy terminal. Shape abnormality of the metal bump may lead to a yield drop or process failure, and thus may also cause the semiconductor device to have inferior electrical characteristics. Therefore, it may be necessary that the metal bump be formed without shape abnormality in manufacturing the semiconductor device.

SUMMARY

Exemplary embodiments of the present inventive concept provide a semiconductor device including a metal bump without shape abnormality and a method of manufacturing the same. The method provided may simplify the manufacturing processes, and may increase yield and productivity, while the semiconductor device provided may have superior electrical characteristics.

According to an exemplary embodiment of the present inventive concept, a semiconductor device may include: a metal line layer on a semiconductor substrate; and a metal terminal on the metal line layer. The metal line layer may include: metal lines; and a passivation layer having a non-planarized top surface including flat surfaces on the metal lines and a concave surface between the metal lines. The metal terminal may be provided on the passivation layer. Opposite lateral surfaces of the metal terminal facing each other are provided on the flat surfaces of the passivation layer.

According to an exemplary embodiment of the present inventive concept, a semiconductor device may include: a semiconductor substrate; a circuit layer disposed on the semiconductor substrate and including a circuit pattern and an interlayer dielectric layer covering the circuit pattern; a metal line layer disposed on the circuit layer and including metal lines and a passivation layer covering the metal lines; and a metal terminal disposed on the passivation layer. The passivation layer may have a non-planarized top surface including flat surfaces on the metal lines and a concave surface between the metal lines. The metal terminal may include facing opposite lateral surfaces provided on the flat surfaces of the passivation layer.

According to an exemplary embodiment of the present inventive concept, a method of manufacturing a semiconductor device may include: providing a semiconductor substrate; forming metal lines on the semiconductor substrate; forming a passivation layer covering the metal lines, the passivation layer having a non-planarized top surface including flat surfaces on the metal lines and a concave surface between the metal lines; and forming a metal terminal on the passivation layer. The metal terminal includes opposite lateral surfaces facing each other provided on the flat surfaces of the passivation layer.

BRIEF DESCRIPTION OF THE DRAWINGS

Exemplary embodiments of the present inventive concept will be more clearly understood from the following detailed description taken in conjunction with the accompanying drawings, in which.

Figure 1A:
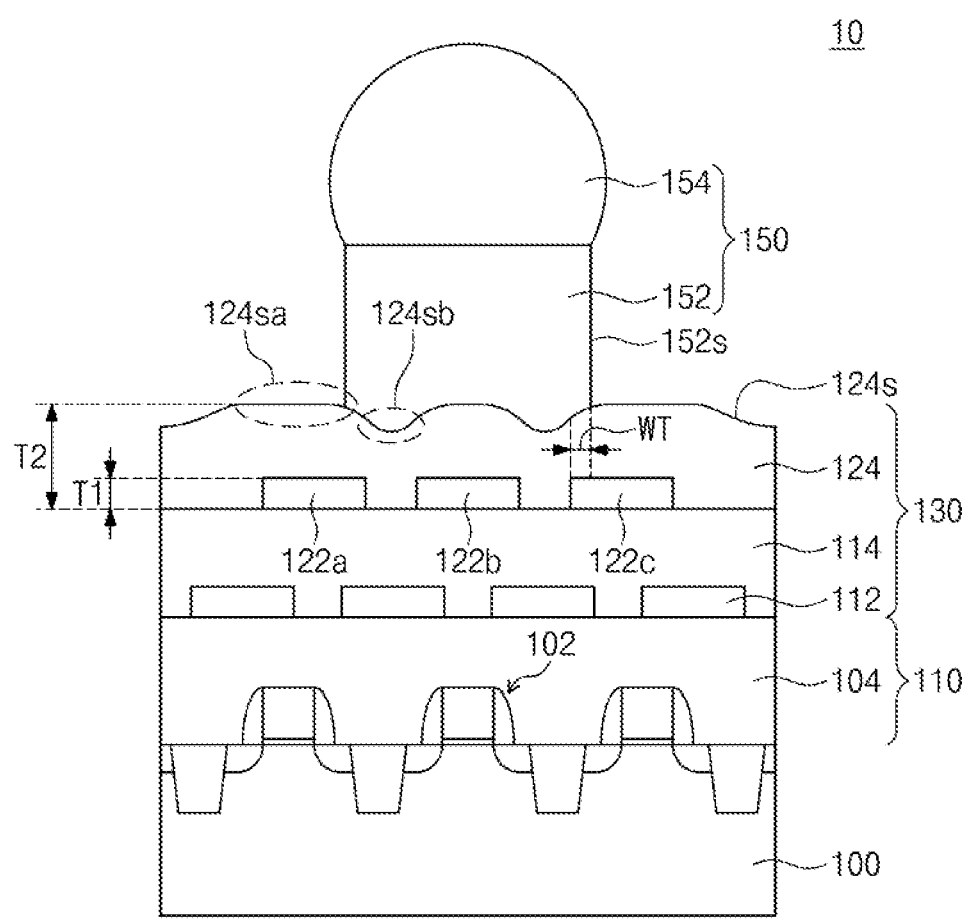
FIG. 1A is a cross-sectional view showing a semiconductor device according to an exemplary embodiment of the present inventive concept.

Since the drawings in FIGS. 1A-7B are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, a semiconductor device having a metal bump and a method of manufacturing the same according to exemplary embodiments of the present inventive concept will be discussed in detail in conjunction with the accompanying drawings.

Figure 1B:
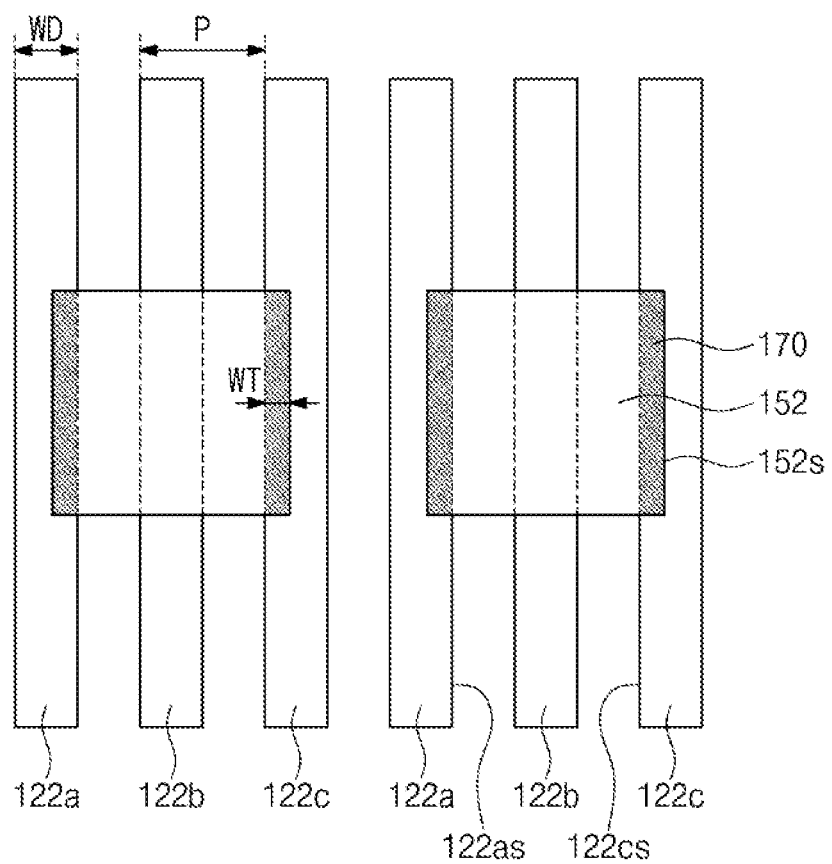
FIG. 1B is a plan view showing the semiconductor device of FIG. 1A.
Figure 1C:
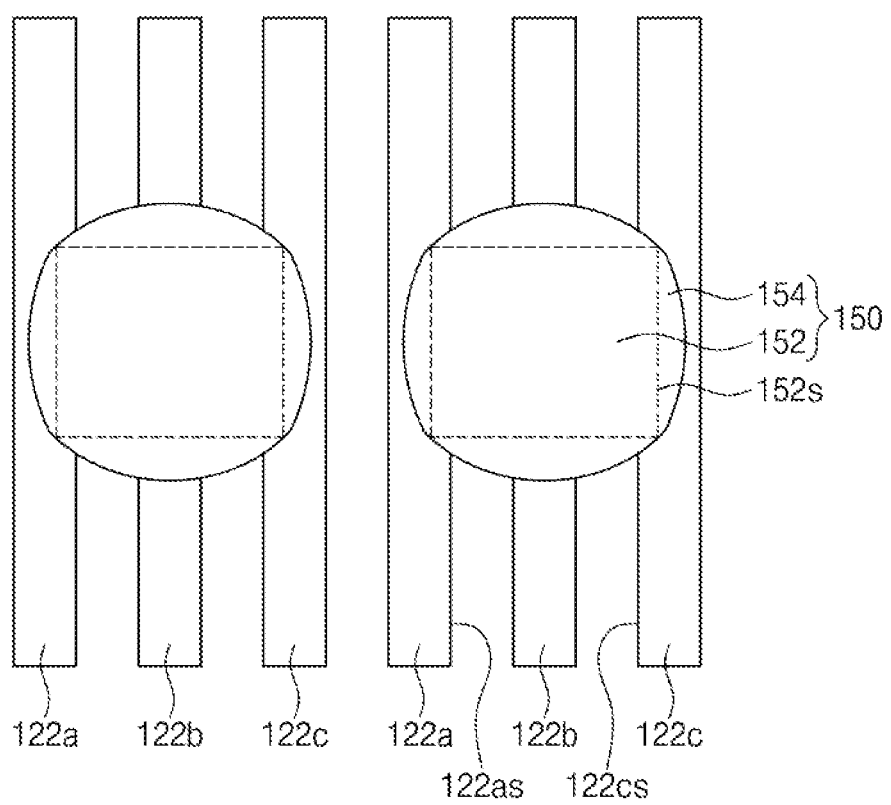
FIG. 1C is a plan view showing the semiconductor device of FIG. 1A.
Figure 1D:
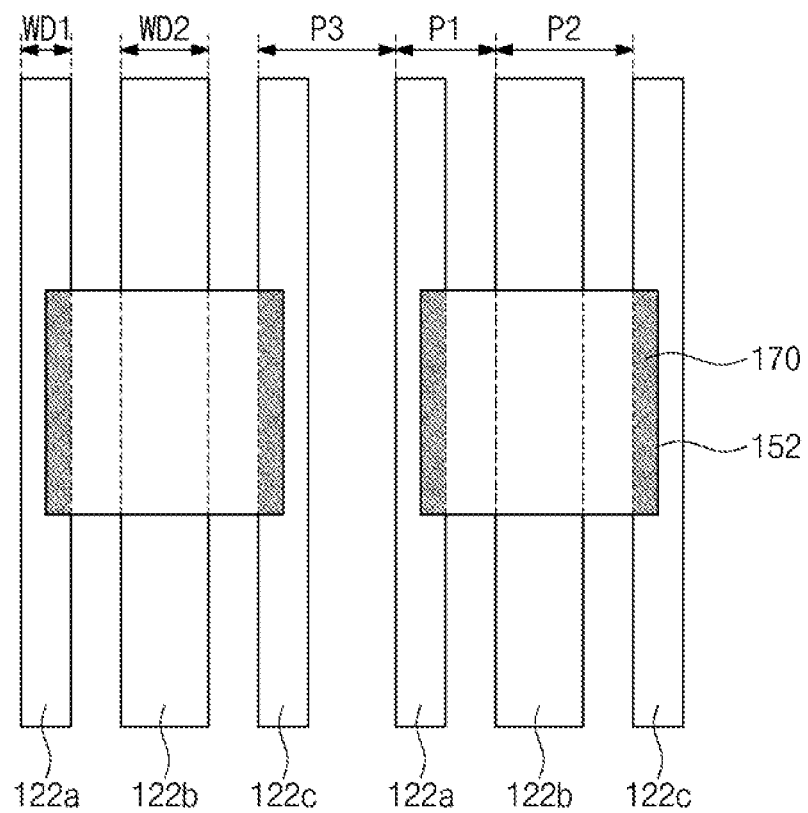
FIG. 1D is a plan view showing other example of FIG. 1B.
Figure 1E:
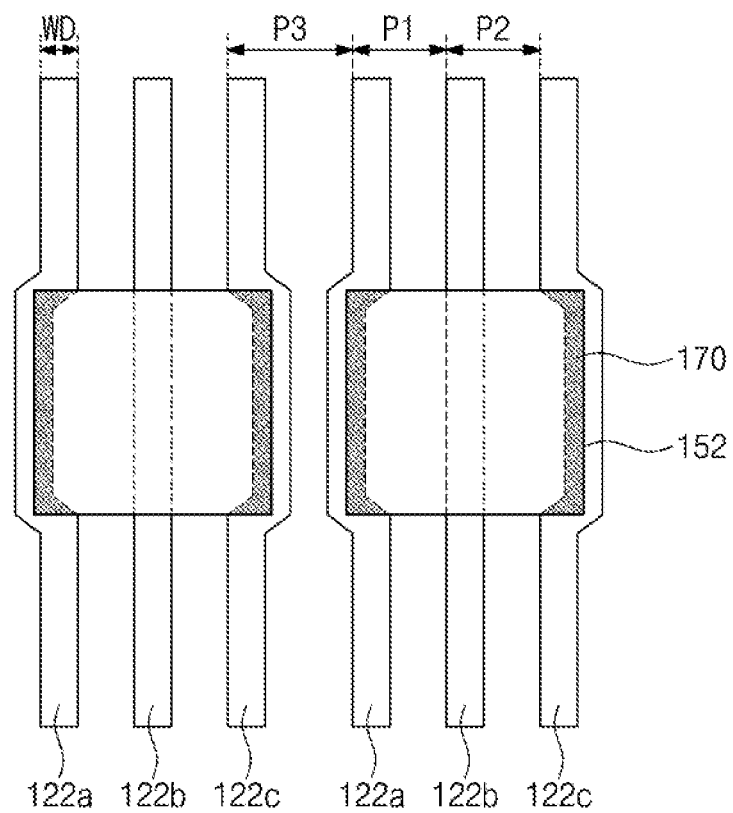
FIG. 1E is a plan view showing other example of FIG. 1B.

FIG. 1A is a cross-sectional view showing a semiconductor device according to an exemplary embodiment of the present inventive concept. FIGS. 1B and 1C are plan views showing the semiconductor device of FIG. 1A. FIGS. 1D and 1E are plan views showing other examples of FIG. 1B.

Referring to FIG. 1A, a semiconductor device 10 may include a semiconductor substrate 100, a circuit layer 110 provided on the semiconductor substrate 100, a metal line layer 130 provided on the circuit layer 110, and one or more metal terminals 150 provided on the metal line layer 130. For example, the circuit layer 110, the metal line layer 130 and the metal terminal 150 may be sequentially stacked on the semiconductor substrate 100.

The circuit layer 110 may include a circuit pattern 102 provided on the semiconductor substrate 100 and an interlayer dielectric layer 104 covering the circuit pattern 102. The semiconductor substrate 100 may include, for example, a silicon (Si) wafer, a germanium (Ge) wafer, a silicon-germanium (Ge) wafer, or a III-V compound semiconductor wafer. The III-V compound semiconductor wafer may include at least one of, for example, aluminum (Al), gallium (Ga), and indium (In), which are Group III elements, and at least one of, for example, phosphorus (P), arsenic (As), and antimony (Sb), which are Group V elements. The circuit pattern 102 may be, for example, a memory circuit, a logic circuit, or a combination thereof, and any of these circuits may include one or more transistors.

The metal line layer 130 may be a single-layer structure. In an exemplary embodiment of the present inventive concept, the metal line layer 130 may include metal lines 122a, 122b and 122c that are provided on the interlayer dielectric layer 104 and a passivation layer 124 that covers the metal lines 122a to 122c. In an exemplary embodiment of the present inventive concept, the metal line layer 130 may be a multi-layer structure. For example, the metal line layer 130 may further include, between the passivation layer 124 and the interlayer dielectric layer 104, metal lines 112 and an intermetal dielectric layer 114 covering the metal lines 112.

The metal terminal 150 may include a metal bump which includes a metal pillar 152 provided on the passivation layer 124 and a capping layer 154 provided on the metal pillar 152. The metal pillar 152 may be in direct contact with the passivation layer 124. The metal terminal 150 may serve as a dummy terminal that is electrically connected neither to the circuit layer 110 nor to the metal line layer 130. Alternatively, the metal terminal 150 may serve as an electrical connection terminal that is electrically connected to the circuit layer 110 and/or the metal line layer 130. More than one metal terminals 150 may be provided on the metal line layer 130, and the metal terminals 150 may include one or both of the dummy terminal and the electrical connection terminal.

The metal lines 122a to 122c may include a first metal line 122a, a second metal line 122b, and a third metal line 122c sequentially arranged beneath the metal terminal 150. The first to third metal lines 122a to 122c may be arranged in a line-and-space fashion (see FIG. 1B). Each of the first to third metal lines 122a to 122c may have a first thickness T1. For example, the thickness T1 of each of the first to third metal lines 122a to 122c may be equal to or greater than about 1 μm.

Referring to FIG. 1B, the first to third metal lines 122a to 122c may have the same width WD and may be arranged at the same pitch P. Each of the first to third metal lines 122a to 122c may have a bar shape that extends in one direction.

The first to third metal lines 122a to 122c may have different widths. For example, as illustrated in FIG. 1D, the first and third metal lines 122a and 122c may have the same first width WD1, and the second metal line 122b may have a second width WD2 greater than the first width WD1. The first and second metal lines 122a and 122b may be arranged at a first pitch P1, the second and third metal lines 122b and 122c may be arranged at a second pitch P2 greater than the first pitch P1, and the first and third metal lines 122a and 122c may be arranged at a third pitch P3 greater than the second pitch P2. The first pitch P1 may include the first width WD1 of the first metal line 122a and a gap width between the first metal line 122a and the second metal line 122b. The second pitch P2 may include the second width WD2 of the second metal line 122b and a gap width between the second metal line 122b and the third metal line 122c. The third pitch P3 may include the first width WD1 of the third metal line 122c and a gap width between the third metal line 122c and the first metal line 122a. Each of the first to third metal lines 122a to 122c may have a bar shape that extends in one direction.

The first to third metal lines 122a to 122c may not all have the bar shape. For example, as illustrated in FIG. 1E, the first to third metal lines 122a to 122c may have the same width WD. The first and second metal lines 122a and 122b may be arranged at a first pitch P1, the second and third metal lines 122b and 122c may be arranged at a second pitch P2 the same as the first pitch P1, and the first and third metal lines 122a and 122c may be arranged at a third pitch P3 greater than the second pitch P2. The second metal line 122b may have a bar shape that extends in one direction. In contrast, each of the first and third metal lines 122a and 122c may have a shape that is bent beneath the metal pillar 152.

Referring back to FIG. 1A, the passivation layer 124 may have a non-planarized top surface 124s. For example, the top surface 124s of the passivation layer 124 may have a relatively even surface 124sa (also referred to as a flat surface) on each of the first to third metal lines 122a to 122c and a curved surface 124sb (also referred to as a concave surface) recessed toward the semiconductor substrate 100 over gaps among the first to third metal lines 122a to 122c. For example, the concave surfaces 124sb may be formed between the first and second metal lines 122a and 122b and between the second and third metal lines 122b and 122c. The passivation layer 124 may have a second thickness T2 greater than the first thickness T1. For example, the second thickness T2 of the passivation layer 124 may be in a range from about 6 μm to about 7 μm. The second thickness T2 of the passivation layer 124 may be defined to refer to a distance between the flat surface 124sa and a top surface of the intermetal dielectric layer 114. The flat surface 124sa may optionally include a convex surface.

The metal terminal 150 may vertically overlap the first to third metal lines 122a to 122c. For example, the metal pillar 152 may be provided on the passivation layer 124 between the first and third metal lines 122a and 122c, and may have facing opposite lateral surfaces 152s provided on the flat surfaces 124sa of the top surface 124s of the passivation layer 124. The facing opposite lateral surfaces 152s of the metal pillar 152 may refer to two side surfaces extending in a direction the same as that of the first and third metal lines 122a and 122c extend in. For example, the metal pillar 152 may be in direct contact with the concave surfaces 124sb between the first and third metal lines 122a and 122c, the flat surface 124sa between the first and third metal lines 122a and 122c such as the flat surface on the second metal line 122b, and a portion of the flat surface 124sa on each of the first and third metal lines 122a and 122c. For example, the opposite lateral surfaces 152s of the metal pillar 152 may be provided on the flat surfaces 124sa of the passivation layer 124 on the first metal line 122a and the third metal line 122c, respectively.

Referring to FIGS. 1A and 1B, when the metal pillar 152 has a rectangular shape in a plan view, the opposite lateral surfaces 152s of the metal pillar 152 may be provided on the first and third metal lines 122a and 122c. The first metal line 122a may have an inner lateral surface 122as facing the second metal line 122b, and similarly, the third metal line 122c may have an inner lateral surface 122cs facing the second metal line 122b. The facing inner lateral surfaces 122as and 122cs of the first and third metal lines 122a and 122c may be closer to the second metal line 122b than the opposite lateral surfaces 152s of the metal pillar 152 is to the second metal line 122b. In such a configuration, the metal pillar 152 may vertically overlap the second metal line 122b and a portion of each of the first and third metal lines 122a and 122c across the passivation layer 124. Each of overlapping areas 170 between the metal pillar 152 and the first metal line 122a and between the metal pillar 152 and the third metal line 122c may have a width WT equal to or greater than about 1 μm.

The capping layer 154 may be formed by solder plating and solder reflow. For example, the capping layer 154 may be formed by plating a solder on the metal pillar 152 and then providing the solder with heat equal to or greater than the melting point of the solder. Therefore, when viewed in plan as illustrated in FIG. 1C, the capping layer 154 may have, for example, a circular shape, a quasi-circular shape, or a rounded rectangular shape on the metal pillar 152 having a rectangular shape. For example, the capping layer 154 may be about 40 μm wide by about 40 μm long. The metal pillar 152 may be less than about 40 μm wide by less than about 40 μm long.

Figure 2A:
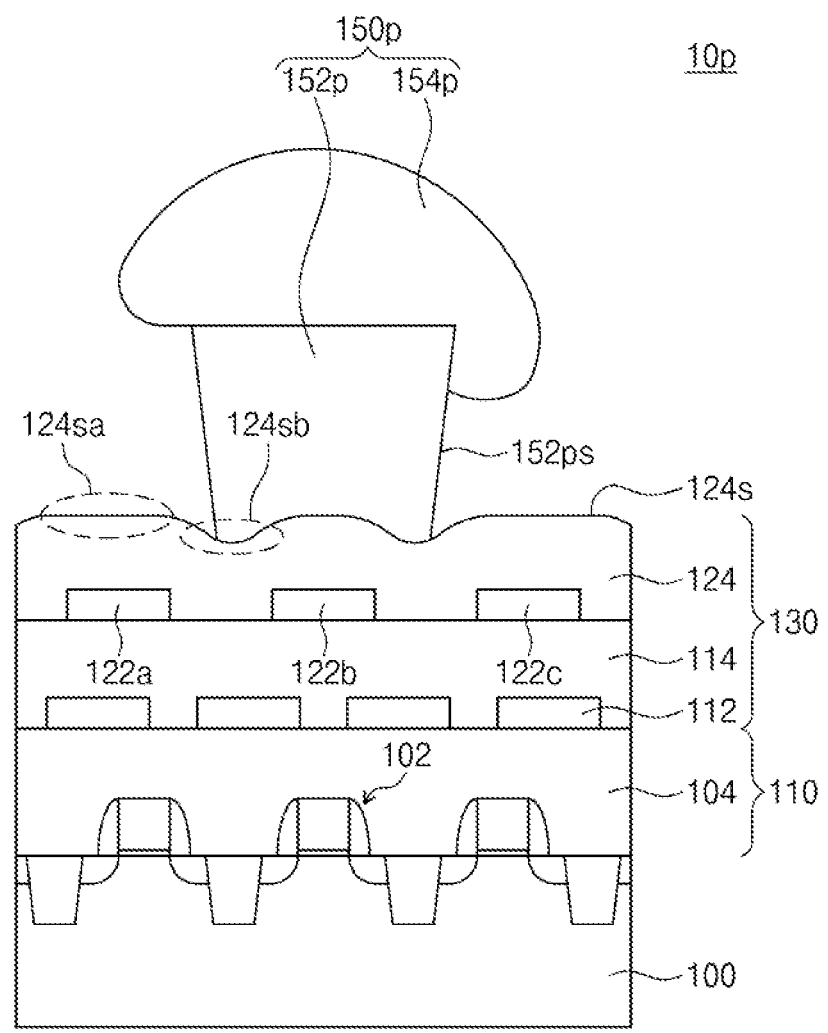
FIG. 2A is a cross-sectional view showing a semiconductor device according to a comparative example.
Figure 2B:
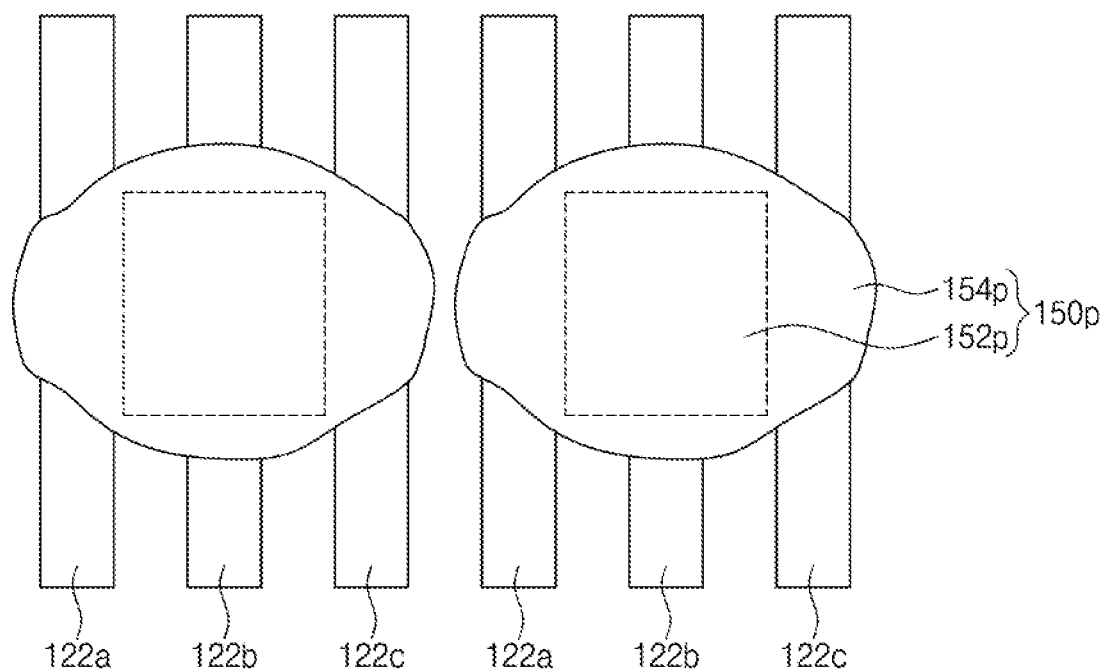
FIG. 2B is a plan view showing the semiconductor device of FIG. 2A.

FIG. 2A is a cross-sectional view showing a semiconductor device according to a comparative example. FIG. 2B is a plan view showing the semiconductor device of FIG. 2A.

Referring to FIGS. 2A and 2B, different from the semiconductor device 10 (as shown in FIG. 1) in which the metal terminal 150 is provided on the flat surface 124sa of the top surface 124s of the passivation layer 124, a comparative semiconductor device 10p may have a structure in which a metal pillar 152p is provided on the concave surface 124sb of the top surface 124s of the passivation layer 124. In this case, a metal pillar 152p and/or a capping layer 154p may have an abnormal shape. For example, when the metal pillar 152p is formed to have opposite lateral surfaces 152ps provided on the concave surfaces 124sb, the metal pillar 152p may have a shape whose width increases with increasing distance from the passivation layer 124 and/or the capping layer 154p may have a shape that sags downward toward the passivation layer 124 along the lateral surface 152ps of the metal pillar 152p. Thus, the metal bump of the comparative semiconductor device 10p may have an abnormal shape.

As illustrated in FIG. 2B, the capping layer 154p may have an elliptical shape extending toward the first and third metal lines 122a and 122c. When the capping layer 154p has an elliptical shape, neighboring metal terminals 150p may be highly likely to come into contact with each other. When the metal terminals 150p are electrical connection terminals, electrical short may occur due to the direct contact between the neighboring metal terminals 150p.

According to an exemplary embodiment of the present inventive concept, as illustrated in FIG. 1A, even though the metal terminal 150 is provided on the passivation layer 124 having the non-planarized top surface 124s, when the metal pillar 152 is provided on the flat surface 124sa of the top surface 124s of the passivation layer 124, the metal terminal 150 may be prevented from being abnormally formed. Since the metal terminal 150 is not abnormally formed, electrical short concern due to the possible direct contact between abnormally formed neighboring metal terminals, such as 150p shown in FIG. 2B, functioning as electrical connection terminals may also be alleviated. This will be clearly understood with reference to FIGS. 6A to 6G.

Figure 3A:
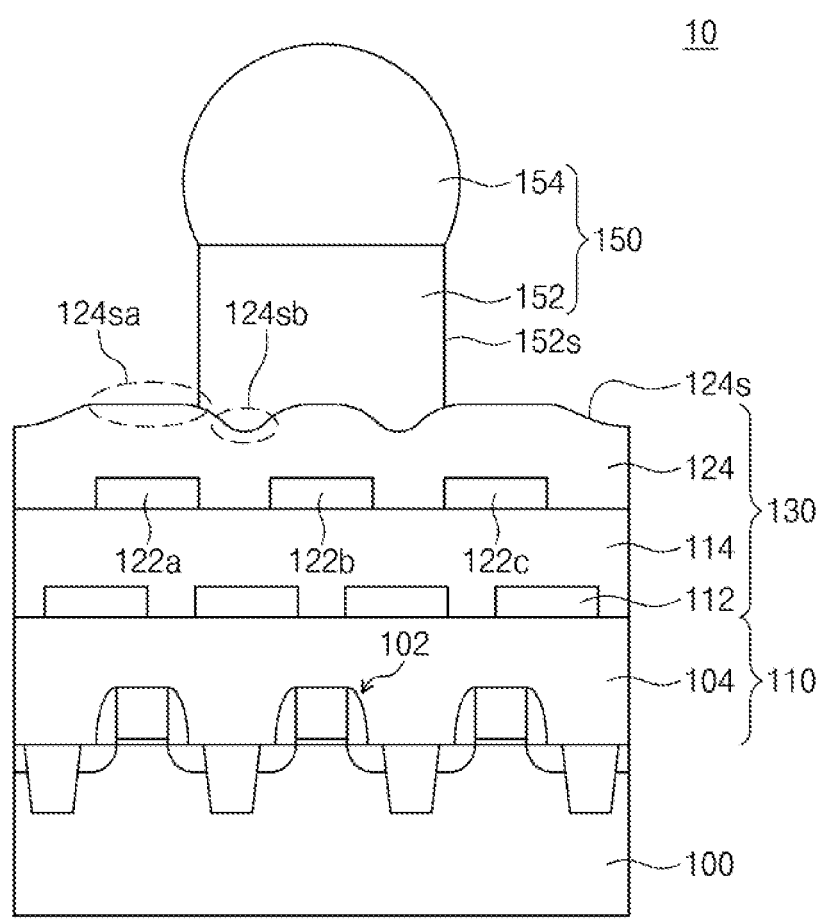
FIG. 3A is a cross-sectional view showing a semiconductor device according to an exemplary embodiment of the present inventive concept.
Figure 3B:
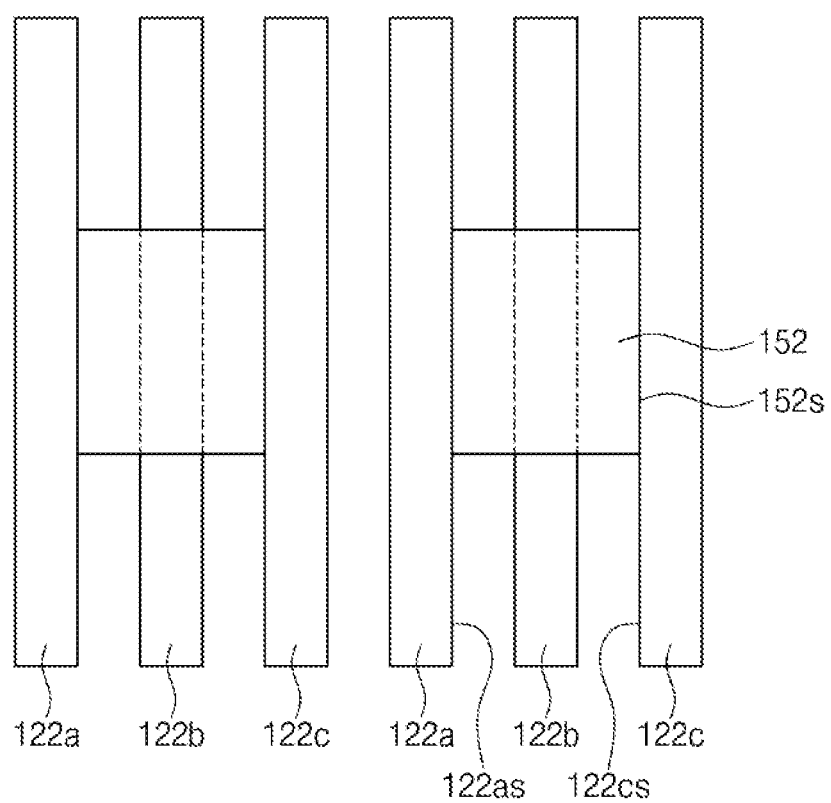
FIG. 3B is a plan view showing the semiconductor device of FIG. 3A.
Figure 3C:
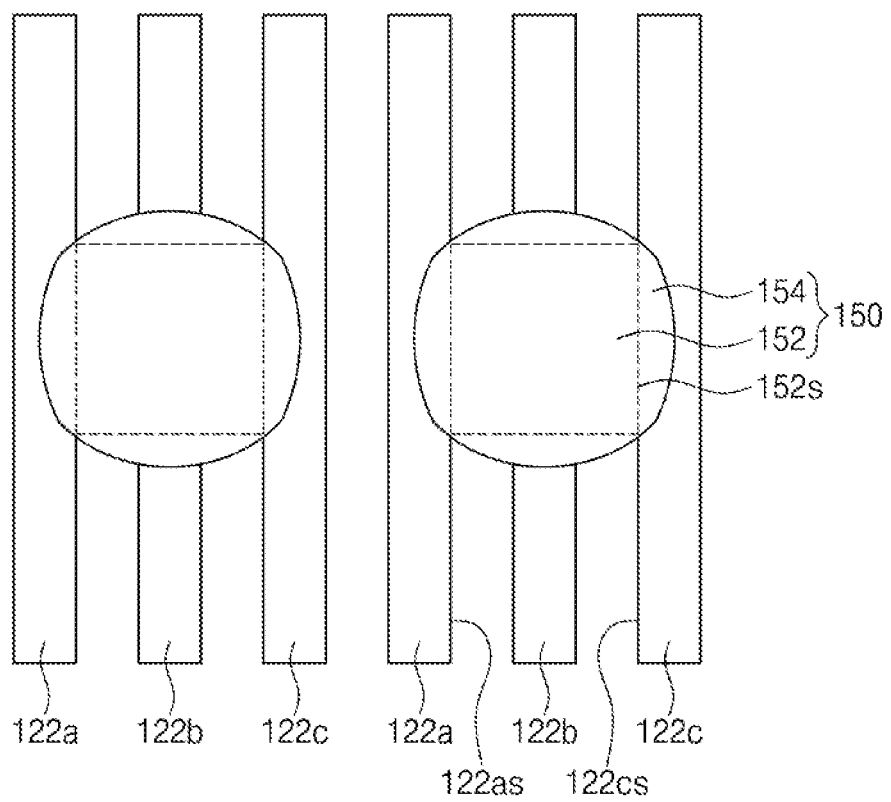
FIG. 3C is a plan view showing the semiconductor device of FIG. 3A.

FIG. 3A is a cross-sectional view showing a semiconductor device according to an exemplary embodiment of the present inventive concept. FIGS. 3B and 3C are plan views showing the semiconductor device of FIG. 3A.

Referring to FIG. 3A, the metal terminal 150 may vertically overlap the second metal line 122b, and may be vertically aligned at lateral surfaces with the first and third metal lines 122a and 122c. For example, as illustrated in FIGS. 3B and 3C, the metal pillar 152 may overlap neither the first metal line 122a nor the third metal line 122c, and the opposite lateral surfaces 152s of the metal pillar 152 may be aligned both with the inner lateral surface 122as of the first metal line 122a and with the inner lateral surface 122cs of the third metal line 122c. For example, the opposite lateral surfaces 152s of the metal pillar 152 may be provided on the flat surfaces 124sa of the passivation layer 124 on the inner lateral surface 122as of the first metal line 122a and on the inner lateral surface 122cs of the third metal line 122c. When the metal pillar 152 is provided on the flat surfaces 124sa of the top surface 124s of the passivation layer 124, the metal terminal 150 may be prevented from being abnormally formed. Since the metal terminal 150 is not abnormally formed, electrical short concern due to the possible direct contact between abnormally formed neighboring metal terminals, such as 150p shown in FIG. 2B, functioning as electrical connection terminals may also be alleviated.

Figure 4A:
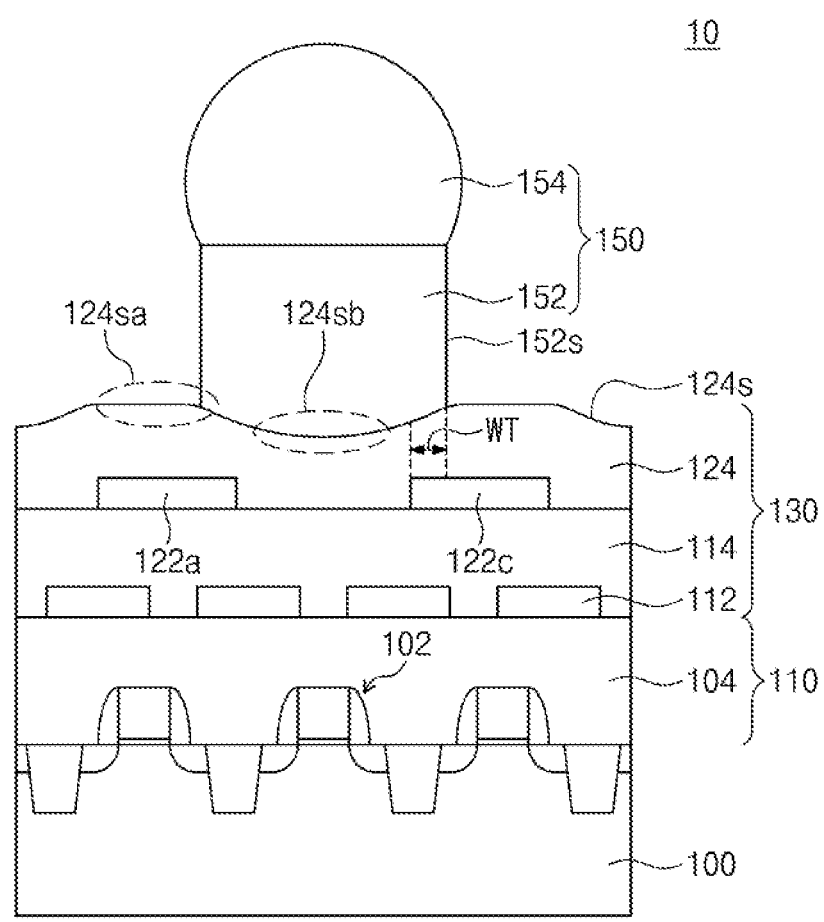
FIGS. 4A and 4B are cross-sectional views showing a semiconductor device according to an exemplary embodiment of the present inventive concept.
Figure 4B:
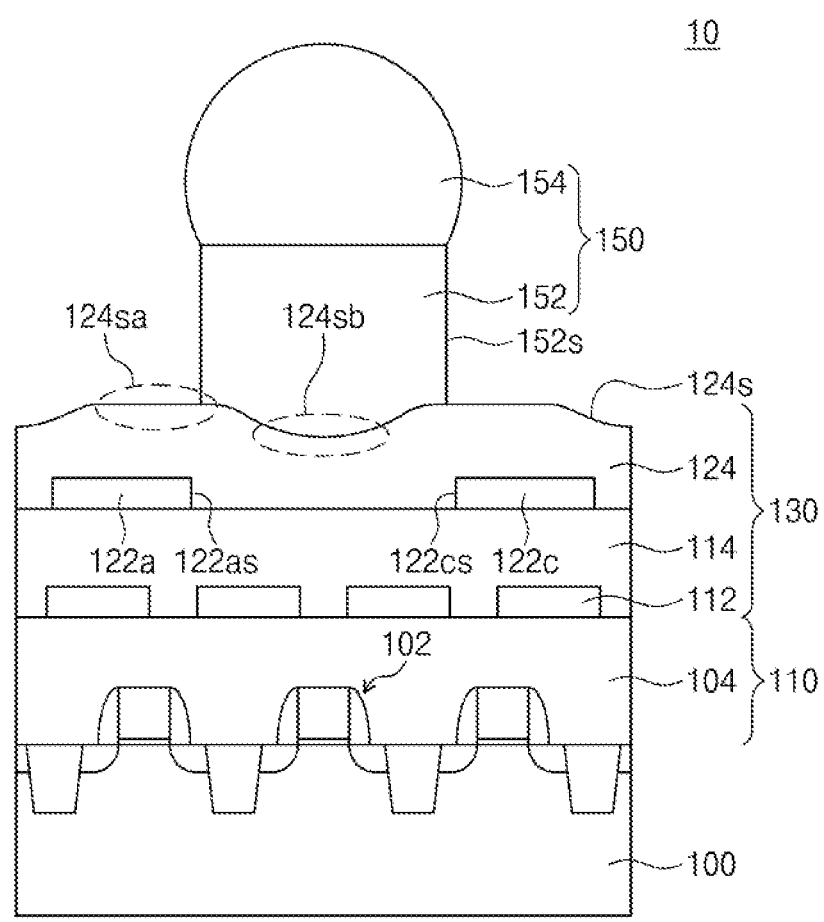

FIGS. 4A and 4B are cross-sectional views showing a semiconductor device according to an exemplary embodiment of the present inventive concept.

Referring to FIG. 4A, no second metal line 122b of FIG. 1A may be provided beneath the metal terminal 150. The metal terminal 150 may have a structure in which the metal pillar 152 vertically overlaps a portion of each of the first and third metal lines 122a and 122c. For example, an overlapping area between the metal pillar 152 and the first metal line 122a and an overlapping area between the metal pillar 152 and the third metal line 122c may have a width WT equal to or greater than about 1 μm. The opposite lateral surfaces 152s of the metal pillar 152 may be provided on the first and third metal lines 122a and 122c. For example, the opposite lateral surfaces 152s of the metal pillar 152 may be provided on the flat surfaces 124sa of the passivation layer 124 on the first and third metal lines 122a and 122c. When the metal pillar 152 is provided on the flat surfaces 124sa of the top surface 124s of the passivation layer 124, the metal terminal 150 may be prevented from being abnormally formed.

Referring to FIG. 4B, no second metal line 122b of FIG. 1A may be provided beneath the metal terminal 150. The metal terminal 150 may have a structure in which the metal pillar 152 is vertically aligned at lateral surfaces both with the first and third metal lines 122a and 122c. For example, the metal pillar 152 may overlap neither the first metal line 122a nor the third metal line 122c, and the opposite lateral surfaces 152s of the metal pillar 152 may be aligned with the facing inner lateral surfaces 122as and 122cs of the first and third metal lines 122a and 122c. For example, the opposite lateral surfaces 152s of the metal pillar 152 may include first and second lateral surfaces, in which the first lateral surface may be aligned with the inner lateral surface 120as of the first metal line 122a, and the second lateral surface may be aligned with the inner lateral surface 122cs of the third metal line 122c. For example, the opposite lateral surfaces 152s of the metal pillar 152 may be provided on the flat surfaces 124sa of the passivation layer 124 on the inner lateral surface 122as of the first metal line 122a and on the inner lateral surface 122cs of the third metal line 122c. When the metal pillar 152 is provided on the flat surfaces 124sa of the top surface 124s of the passivation layer 124, the metal terminal 150 may be prevented from being abnormally formed.

Figure 5A:
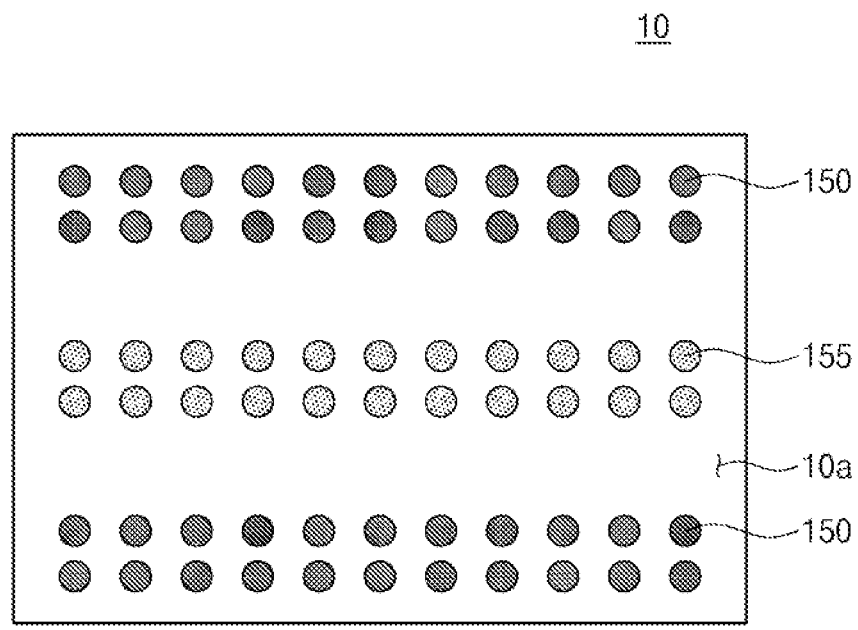
FIG. 5A is a cross-sectional view showing a semiconductor device according to an exemplary embodiment of the present inventive concept.
Figure 5B:
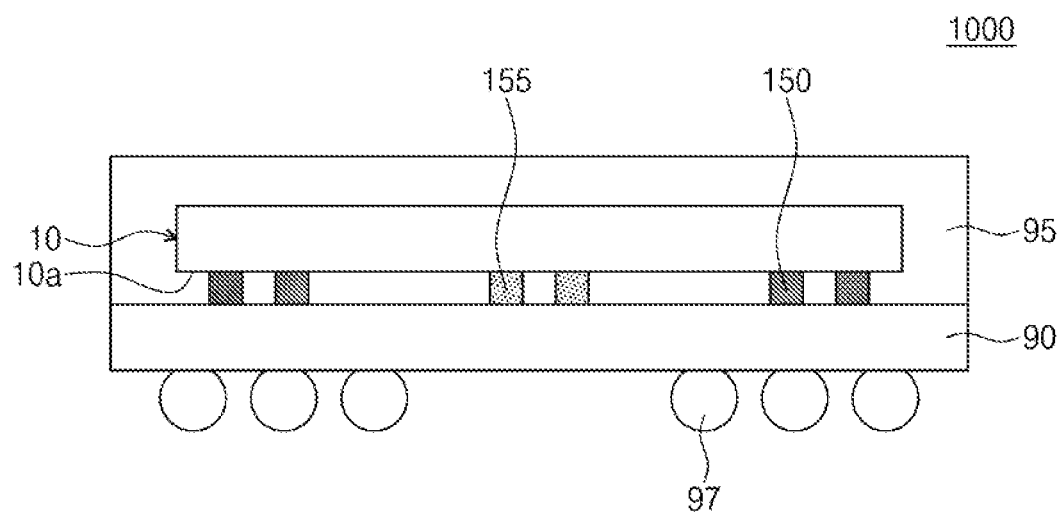
FIG. 5B is a cross-sectional view showing a semiconductor package including a semiconductor device according to an exemplary embodiment of the present inventive concept.

FIG. 5A is a cross-sectional view showing a semiconductor device according to an exemplary embodiment of the present inventive concept. FIG. 5B is a cross-sectional view showing a semiconductor package including a semiconductor device according to an exemplary embodiment of the present inventive concept.

Referring to FIGS. 5A and 5B, a package substrate 90 may be flip-chip bonded thereon with the semiconductor device 10 arbitrarily chosen from those discussed above and having an active surface 10a of which the semiconductor device 10 faces the package substrate 90, thus the above configuration may constitute a semiconductor package 1000. The semiconductor device 10 may be encapsulated by a mold layer 95 provided on the package substrate 90. The semiconductor package 1000 may be electrically connected to an external electrical device through one or more outer terminals 97 provided on the package substrate 90.

The metal terminals 150 provided on the active surface 10a of the semiconductor device 10 may serve as dummy terminals that mechanically support the semiconductor device 10 on the package substrate 90. The semiconductor device 10 may further include metal terminals 155 electrically connecting the package substrate 90 and the semiconductor device 10 to each other. For example, the metal terminals 155 may be arranged in one or more rows along a center of the semiconductor device 10. The metal terminals 150 may be arranged in one or more rows along opposite edges of the semiconductor device 10. Alternatively, one or more of the metal terminals 150 may be electrical connection terminals like the metal terminals 155. Although as exemplified in the horizontal cross-sectional view in FIG. 5A, two rows of the metal terminals 155 are arranged along the center of the semiconductor device 10, and two rows of the of the metal terminals 150 are arranged along each of opposite edges of the semiconductor device 10, the present inventive concept is not limited thereto.

FIGS. 6A to 6G are cross-sectional views showing a method of manufacturing a semiconductor device according to an exemplary embodiment of the present inventive concept.

Figure 6A:
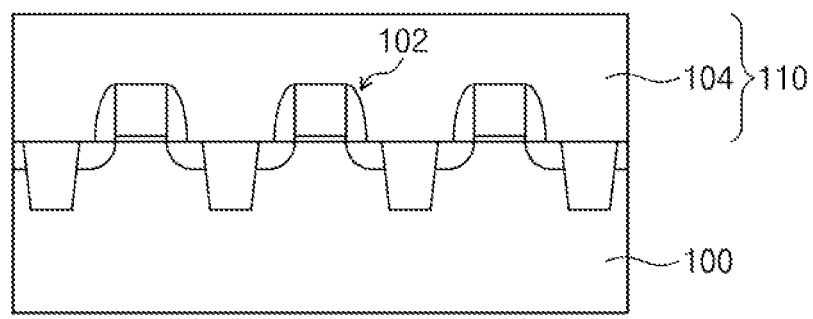
FIGS. 6A to 6G are cross-sectional views showing a method of manufacturing a semiconductor device according to an exemplary embodiment of the present inventive concept.

Referring to FIG. 6A, a circuit layer 110 may be formed on a semiconductor substrate 100. The semiconductor substrate 100 may be, for example, a silicon (Si) wafer, a germanium (Ge) wafer, a silicon-germanium (SiGe) wafer, or a III-V compound semiconductor wafer. The III-V compound semiconductor wafer may include at least one of, for example, aluminum (Al), gallium (Ga), and indium (In), which are Group III elements, and at least one of, for example, phosphorus (P), arsenic (As), and antimony (Sb), which are Group V elements. The formation of the circuit layer 110 may include forming on the semiconductor substrate 100 a circuit pattern 102 having one or more transistors, and forming an interlayer dielectric layer 104 covering the circuit pattern 102. The circuit pattern 102 may be, for example, a memory chip, a logic chip, or a combination thereof. The interlayer dielectric layer 104 may be formed by deposing an insulating material such as, for example, silicon oxide ($SiO_2$) or silicon nitride ($Si_3N_4$) on the substrate 100 to cover the circuit pattern 102.

Figure 6B:
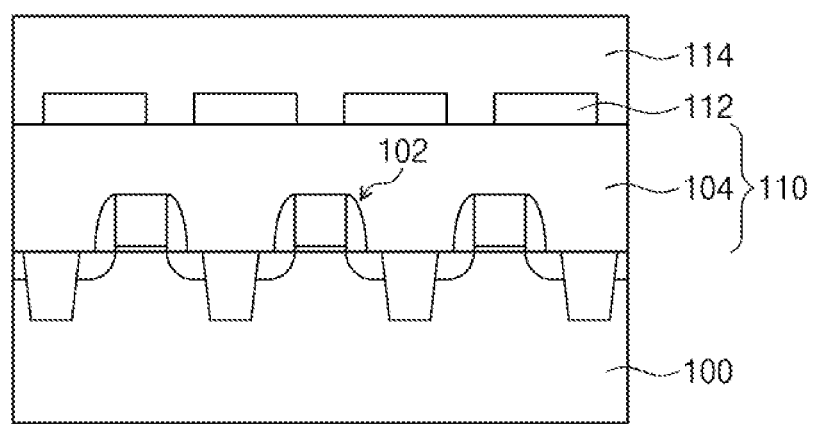

Referring to FIG. 6B, the circuit layer 110 may be provided thereon with metal lines 112 (also referred to as lower metal lines) and an intermetal dielectric layer 114 covering the lower metal lines 112. The lower metal lines 112 may include metal such as, for example, copper (Cu) or aluminum (Al). The intermetal dielectric layer 114 may be formed by deposing an insulating material such as, for example, silicon oxide ($SiO_2$) or silicon nitride ($Si_3N_4$) on the circuit layer 110 to cover the lower metal lines 112.

Figure 6C:
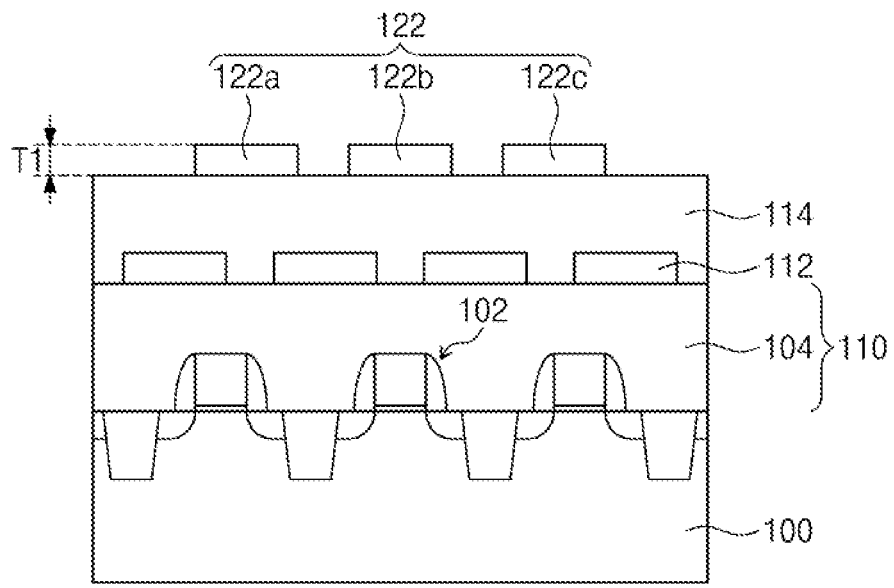

Referring to FIG. 6C, metal lines 122 (also referred to as upper metal lines) may be formed on the intermetal dielectric layer 114. The upper metal lines 122 may include metal such as, for example, copper (Cu) or aluminum (Al). The upper metal lines 122 may include a first metal line 122a, a second metal line 122b, and a third metal line 122c.

Each of the first to third metal lines 122a to 122c may have a first thickness T1. For example, the first thickness T1 may be equal to or greater than about 1 μm. The first to third metal liens 122a to 122c may be arranged at the same or different pitches while having the same or different widths. For example, the first to third metal lines 122a to 122c may be formed in a line-and-space fashion as shown in FIG. 1B. Alternatively, the first to third metal lines 122a to 122c may be formed to have an arrangement the same as or similar to that shown in FIG. 1D or FIG. 1E.

Figure 6D:
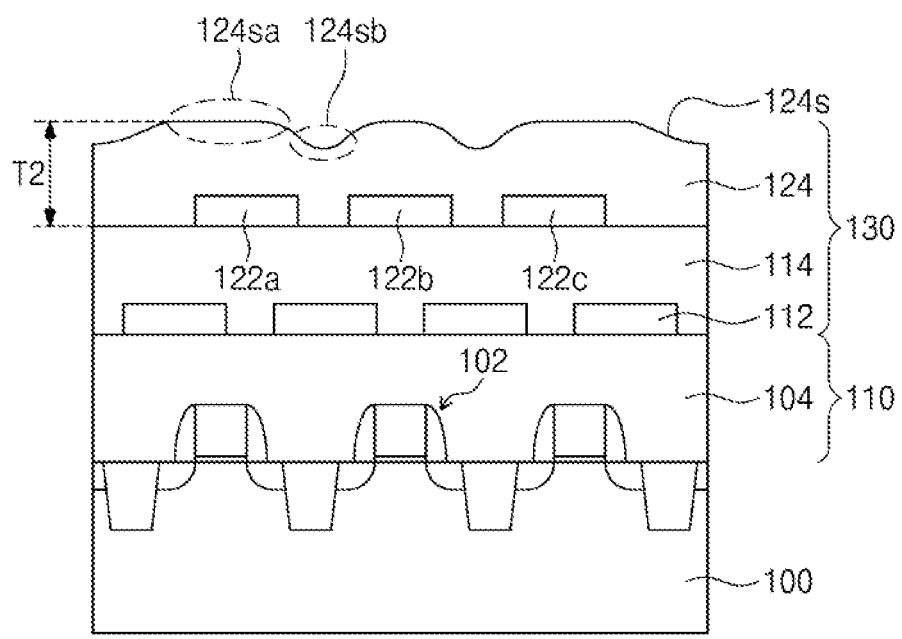

Referring to FIG. 6D, a passivation layer 124 may be formed on the intermetal dielectric layer 114 to cover the first to third metal lines 122a to 122c. The passivation layer 124 may be formed by depositing an insulating material such as, for example, silicon oxide ($SiO_2$), silicon nitride ($Si_3N_4$), or photosensitive polyimide (PSPI) on the intermetal dielectric layer 114. As such, a metal line layer 130 may be formed to have the lower metal lines 112 and the upper metal lines 122.

In an exemplary embodiment of the present inventive concept, no lower metal lines 112 of FIG. 6C may be formed. For example, the metal line layer 130 may have a single-layer structure including the passivation layer 124 covering the first to third metal lines 122a to 122c formed on the interlayer dielectric layer 104.

The passivation layer 124 may be formed by depositing an insulating material without performing a planarization process. Because no planarization process is performed, the passivation layer 124 may have a non-planarized top surface 124s. For example, the top surface 124s of the passivation layer 124 may have a relatively even surface 124sa (also referred to as a flat surface) on each of the first to third metal lines 122a to 122c and a curved surface 124sb (also referred to as a concave surface) recessed toward the semiconductor substrate 100 over each of gaps between the first to third metal lines 122a to 122c. The flat surface 124sa and the concave surface 124sb may be alternately and repeatedly arranged to form the non-planarized surface 124s of the passivation layer 124. The flat surface 124sa may optionally include a convex surface. Thus, the passivation layer 124 may have a non-planarized surface 124s which may include the flat surfaces 124sa on the upper metal lines 122, for example, on the first to third metal lines 122a to 122c, and a concave surface 124*sb* between upper metal lines 122, for example, between the first and second metal lines 122*a* and 122*b* and between the second and third metal lines 122*b* and 122*c*.

The passivation layer 124 may be formed to have a second thickness T2 large enough to sufficiently cover the first to third metal lines 122*a* to 122*c*. For example, the second thickness T2 may be in a range from about 6 μm to about 7 μm. The second thickness T2 may indicate a distance between the flat surface 124*sa* and a top surface of the intermetal dielectric layer 114.

Figure 6E:
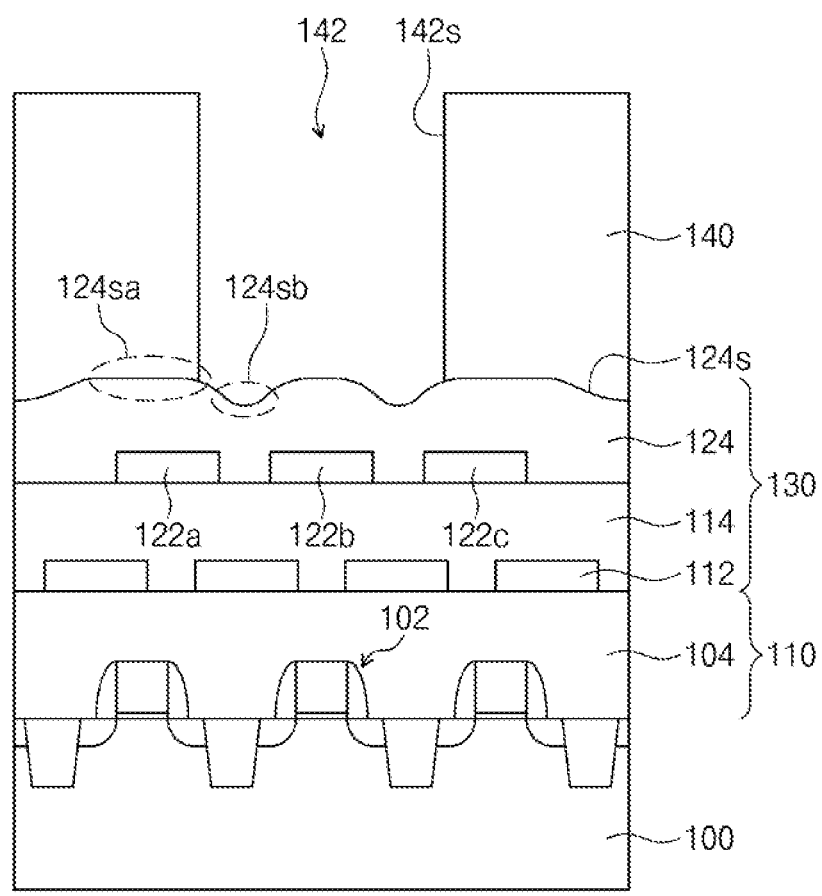

Referring to FIG. 6E, a mask pattern 140 may be formed on the passivation layer 124. For example, the mask pattern 140 may be formed of a photoresist or an insulating material exhibiting etch selectivity to the passivation layer 124. The mask pattern 140 may include an opening 142 defined by a photolithography process. The opening 142 may have, for example, a circular shape, a rectangular shape, or a polygonal shape in a plan view.

The opening 142 may reveal the concave surfaces 124*sb* between the first and second metal lines 122*a* and 122*b* and between the second and third metal lines 122*b* and 122*c*. The opening 142 may also reveal the flat surface 124*sa* on the second metal line 122*b*. In addition, the opening 142 may reveal at least a portion of the flat surface 124*sa* on each of the first and third metal lines 122*a* and 122*c*.

The opening 142 may have facing inner sidewalls 142*s* on the first and third metal lines 122*a* and 122*c*. For example, the inner sidewalls 142*s* of the opening 142 may be provided on the flat surfaces 124*sa* of the passivation layer 124 on the first and third metal lines 122*a* and 122*c*. Alternatively, the inner sidewalls 142*s* of the opening 142 may be aligned with inner lateral surfaces (see 122*as* and 122*cs* of FIG. 1B), which face the second metal line 122*b*, of the first and third metal lines 122*a* and 122*c*. For example, the inner sidewalls 142*s* of the opening 142 may be provided on the flat surfaces 124*sa* of the passivation layer 124 on the inner lateral surface 122*as* of the first metal line 122*a* and on the inner lateral surface 122*cs* of the third metal line 122*c*.

Figure 6F:
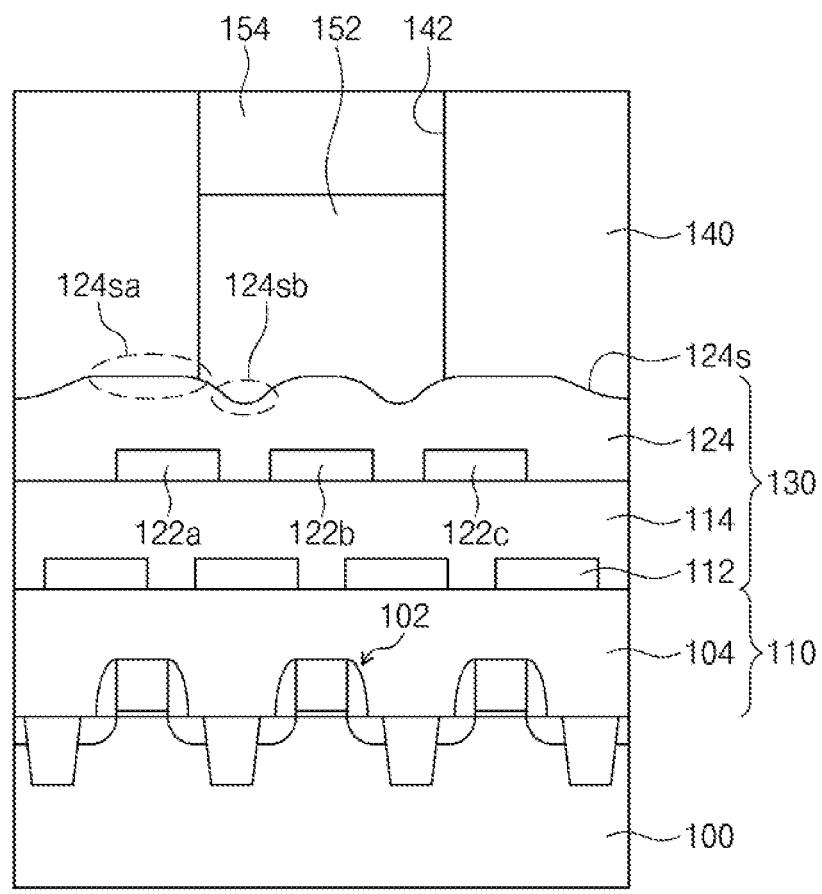

Referring to FIG. 6F, a plating or deposition process may be performed to form a metal pillar 152 and a capping layer 154 in the opening 142 of the mask pattern 140. The metal pillar 152 may be formed by plating or depositing copper (Cu) in the opening 142. The capping layer 154 may be formed by plating or depositing solder on the metal pillar 152 in the opening 142. When the plating process is performed, a seed layer including metal may be formed in the opening 142. When the plating process is performed to form the metal pillar 152, the seed layer may constitute a portion of the metal pillar 152 and may be formed on the passivation layer 124 in the opening 142. Thus, the metal pillar 152 may be in direct contact with the passivation layer 124 exposed to the opening 142.

The metal pillar 152 may be electrically connected neither to the circuit pattern 102 in the circuit layer 110 nor to the metal lines 112 and 122*a* to 122*c* in the metal line layer 130. Alternatively, the metal pillar 152 may be electrically connected to one or more of the circuit pattern 102 and the metal lines 112 and 122*a* to 122*c*.

Figure 6G:
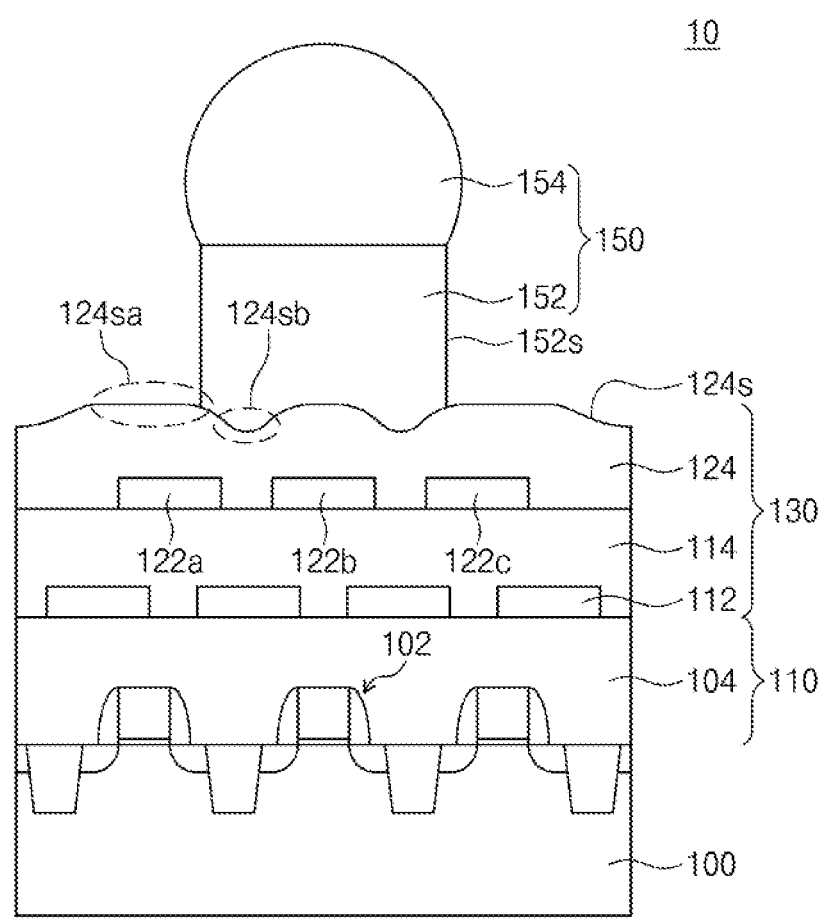

Referring to FIG. 6G, the mask pattern 140 may be removed, and then a reflow process may be performed. The reflow process may cause the capping layer 154 to have a substantially spherical shape. The capping layer 154 may have, for example, a circular shape, a quasi-circular shape, or a rounded rectangular shape in a plan view (see FIG. 1C). A semiconductor device 10 as shown in FIG. 1A may be manufactured through the processes described above. A semiconductor device 10 as shown in FIG. 3A, 4A, or 4B may be manufactured by performing processes the same or similar to those discussed above.

Figure 7A:
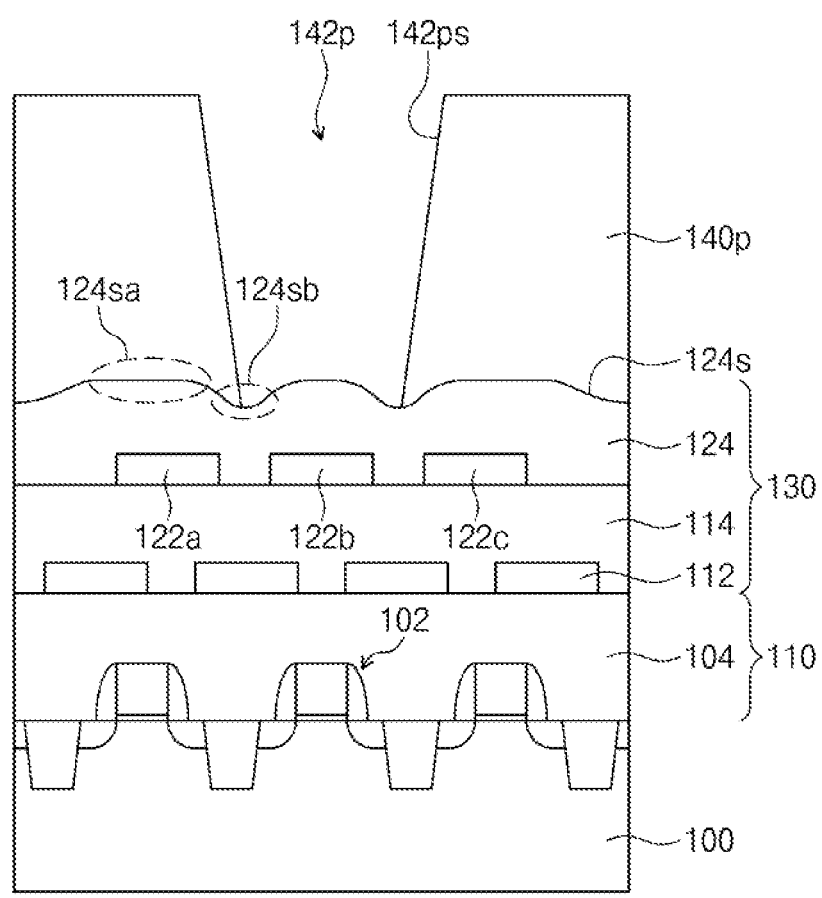
FIGS. 7A and 7B are cross-sectional views showing a method of manufacturing a semiconductor device according to a comparative example.
Figure 7B:
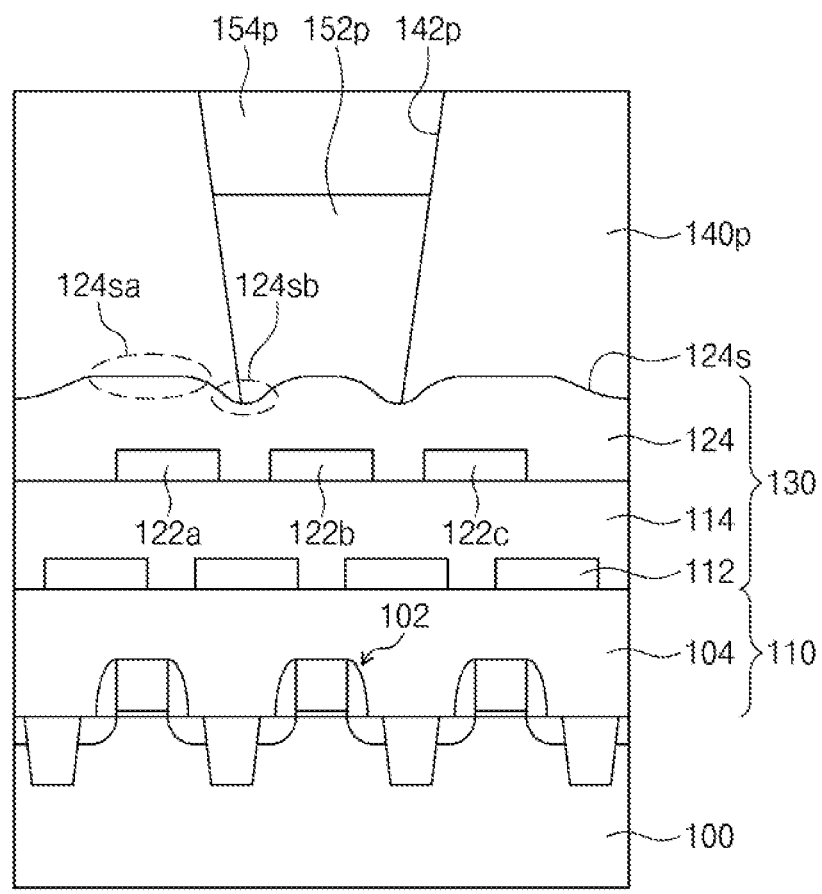

FIGS. 7A and 7B are cross-sectional views showing a method of manufacturing a semiconductor device according to a comparative example.

As illustrated in FIG. 7A, a mask pattern 140*p* may be formed to place inner sidewalls 142*ps* of an opening 142*p* onto the concave surfaces 124*sb* of the top surface 124*s* of the passivation layer 124. In this case, when a photolithography process is performed to form the opening 142*p*, light may be irregularly reflected on the concave surface 124*sb*. The irregular light reflection may compel the inner sidewalls 142*ps* of the opening 142*p* to incline outward from the concave surfaces 124*sb*. For example, the opening 142*p* may have a width that increases with increasing distance from the passivation layer 124.

As illustrated in FIG. 7B, when a metal pillar 152*p* and a capping layer 154*p* are formed in the opening 142*p* whose width increases with increasing distance from the passivation layer 124 and then a reflow process is performed on the capping layer 154*p*, a metal terminal 150*p* may be formed to have an abnormal shape as shown in FIGS. 2A and 2B.

According to the exemplary embodiment of the present inventive concept as illustrated in FIG. 6E, the mask pattern 140 may be formed to have the opening 142 whose inner sidewalls 142*s* are provided on the flat surfaces 124*sa* of the top surface 124*s* of the passivation layer 124. For example, the inner sidewalls 142*s* of the opening 142 may vertically or almost vertically extend from the flat surfaces 124*sa* on which the irregular light reflection does not occur or minimally occurs. The opening 142 may then be formed to have a uniform thickness. As a result, the metal pillar 152 and the capping layer 154 may be free of the shape abnormality discussed with reference to FIGS. 2A and 2B. In addition, as discussed above with reference to FIG. 6D, since no planarization process is performed on the passivation layer 124, it may be possible to simplify processes and increase productivity.

According to the exemplary embodiments of the present inventive concept described above, although no planarization process is performed on the passivation layer, a semiconductor device may be manufactured to have the metal bump without shape abnormality. The present inventive concept may allow the number of process steps to be reduced and the processes to be simplified in the manufacturing of a semiconductor device, thereby providing a superior method of manufacturing the semiconductor device having the metal bump. In addition, the reduction in number of process steps may lead to a decrease in manufacturing cost and an increase in yield and productivity.

This detailed description of the present inventive concept should not be construed as limited to the specific exemplary embodiments set forth herein, and it is intended to cover various combinations, modifications and variations of the exemplary embodiments described above, as well as other embodiments, without departing from the spirit and scope of the present inventive concept as defined by the appended claims.

What is claimed is:

1. A semiconductor device comprising:
   metal lines on a semiconductor substrate;
   a passivation layer covering the metal lines, a top surface of the passivation layer has curved portions; and
   a metal terminal on the passivation layer, the metal terminal including opposite lateral surfaces facing each other on the top surface of the passivation layer, wherein one of the metal lines is disposed under one of the opposite lateral surfaces of the metal terminal facing each other, and an overlapping area between the metal terminal and the one of the metal lines has a width equal to or greater than about 1 μm.

2. The semiconductor device of claim 1, wherein
the top surface of the passivation layer has flat portions on the metal lines and each between the curved portions or next to an end unit of the curved portions, and
the opposite lateral surfaces of the metal terminal are provided on the flat portions of the passivation layer.

3. The semiconductor device of claim 1, wherein
the metal lines comprise a first metal line and a second metal line, the first metal line having an inner lateral surface facing the second metal line and the second metal line having an inner lateral surface facing the first metal line, and
the opposite lateral surfaces of the metal terminal comprise:
  a first lateral surface aligned with the inner lateral surface of the first metal line; and
  a second lateral surface aligned with the inner lateral surface of the second metal line.

4. The semiconductor device of claim 3, wherein
the first lateral surface of the metal terminal is provided on a first portion between the curved portions of the passivation layer with the first portion located on the inner lateral surface of the first metal line, and
the second lateral surface of the metal terminal is provided on a second portion between the curved portions of the passivation layer with the second portion located on the inner lateral surface of the second metal line.

5. The semiconductor device of claim 4, wherein
The first portion and the second portion are flat portions on the metal lines and each between the curved portions or next to an end unit of the curved portions.

6. The semiconductor device of claim 1, wherein
the metal lines comprise a first metal line, a second metal line and a third metal line, the first to third metal lines being sequentially arranged beneath the metal terminal, and
viewing along a direction crossing the first to third metal lines, the metal terminal overlaps an entirety of the second metal line and a portion of each of the first and third metal lines.

7. The semiconductor device of claim 1, wherein
the metal lines comprise a first metal line, a second metal line and a third metal line, the first to third metal lines being sequentially arranged beneath the metal terminal, and
the metal terminal overlaps the second metal line and the opposite lateral surfaces of the metal terminal vertically aligned with inner lateral surfaces of the first and third metal lines, respectively,
wherein the vertically aligned means aligned in a direction perpendicular to a top surface of the semiconductor substrate.

8. The semiconductor device of claim 1, wherein the metal terminal comprises:
  a metal pillar on the passivation layer; and
  a capping layer on the metal pillar,
  wherein the metal pillar is in direct contact with the passivation layer.

9. The semiconductor device of claim 1, further comprising a circuit layer disposed between the semiconductor substrate and the metal lines, wherein the metal terminal comprises one of:
  a dummy terminal electrically connected neither to the circuit layer nor to the metal lines; and
  an electrical connection terminal electrically connected to at least one of the circuit layer and the metal lines.

10. The semiconductor device of claim 1, wherein each of the metal lines has a thickness equal to or greater than about 1 μm.

11. The semiconductor device of claim 1, wherein the passivation layer has a thickness ranging from about 6 μm to about 7 μm.

12. A semiconductor device comprising:
  a semiconductor substrate;
  a circuit layer disposed on the semiconductor substrate and comprising a circuit pattern and an interlayer dielectric layer covering the circuit pattern;
  a metal line layer disposed on the circuit layer and comprising metal lines and a passivation layer covering the metal lines; and
  a metal terminal disposed on the passivation layer,
  wherein a top surface of the passivation layer has flat portions on the metal lines and curved portions between the flat portions,
  each of the metal lines has a thickness equal to or greater than about 1 μm, and
  the passivation layer has a thickness ranging from about 6 μm to about 7 μm.

13. The semiconductor device of claim 12, the metal terminal comprises facing opposite lateral surfaces provided on the flat portions of the passivation layer.

14. The semiconductor device of claim 13, wherein
the metal lines comprise a first metal line and a second metal line,
the facing opposite lateral surfaces of the metal terminal and inner lateral surfaces of the first and second metal lines are vertically aligned with each other, respectively, across the passivation layer, and
the metal terminal does not overlap any of the first and second metal lines.

15. The semiconductor device of claim 14, wherein
the metal lines further comprise a third metal line disposed between the first and second metal lines, and
the metal terminal overlaps the third metal line across the passivation layer.

16. The semiconductor device of claim 12, wherein
the metal lines comprise a first metal line and a second metal line, and
the metal terminal and each of the first and second metal lines are partially overlapped with each other across the passivation layer.

17. The semiconductor device of claim 16, wherein
Each of overlapping areas between the metal terminal and the first metal line and between the metal terminal and the second metal line has a width equal to or greater than about 1 μm.

18. The semiconductor device of claim 16, wherein
the metal lines further comprise a third metal line disposed between the first and second metal lines, and
the metal terminal overlaps the third metal line across the passivation layer.

19. The semiconductor device of claim 12, wherein
each of the metal lines has a thickness equal to or greater than about 1 μm, and
the passivation layer has a thickness ranging from about 6 μm to about 7 μm.

20. The semiconductor device of claim 12, wherein the metal terminal comprises one of:
- a dummy terminal electrically connected neither to the circuit layer nor to the metal lines; and
- an electrical connection terminal electrically connected to at least one of the circuit layer and the metal lines.

* * * * *